US009596779B2

(12) United States Patent
Shirasaki

(10) Patent No.: US 9,596,779 B2
(45) Date of Patent: Mar. 14, 2017

(54) ELEMENT HOUSING PACKAGE AND MOUNTING STRUCTURE PROVIDED WITH SAME

(71) Applicant: KYOCERA Corporation, Kyoto-shi, Kyoto (JP)

(72) Inventor: Takayuki Shirasaki, Kyoto (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 14/787,880

(22) PCT Filed: Aug. 27, 2014

(86) PCT No.: PCT/JP2014/072381
§ 371 (c)(1),
(2) Date: Oct. 29, 2015

(87) PCT Pub. No.: WO2015/030034
PCT Pub. Date: Mar. 5, 2015

(65) Prior Publication Data
US 2016/0081216 A1    Mar. 17, 2016

(30) Foreign Application Priority Data
Aug. 28, 2013 (JP) ................................ 2013-176379

(51) Int. Cl.
*H05K 7/14* (2006.01)
*H01L 23/057* (2006.01)

(52) U.S. Cl.
CPC ......... *H05K 7/1427* (2013.01); *H01L 23/057* (2013.01); *H01L 2924/0002* (2013.01)

(58) Field of Classification Search
CPC ................ H05K 7/1427; H01L 23/057; H01L 2924/0002
(Continued)

(56) References Cited

U.S. PATENT DOCUMENTS 7,081,691 B2 * 7/2006 Kawata ................ H05K 1/0203
307/9.1
7,667,971 B2 * 2/2010 Tominaga ............ B62D 5/0406
361/706
(Continued)

FOREIGN PATENT DOCUMENTS

JP    2003-309312 A    10/2003

OTHER PUBLICATIONS

International Search Report, PCT/JP2014/072381, Dec. 2, 2014, 2 pgs.

*Primary Examiner* — Courtney Smith
*Assistant Examiner* — Sagar Shrestha
(74) *Attorney, Agent, or Firm* — Volpe and Koenig, P.C.

(57) ABSTRACT

An element housing package is provided with: a base plate including, on a top surface, a mounting region for mounting an element; a frame body disposed on the top surface of the base plate so as to surround the mounting region, the frame body including a through-hole; a connector disposed so as to pass through the through-hole T of the frame body and to extend from the inside to the outside of the frame body; a pedestal member disposed on the top surface of the base plate so as to be positioned in the frame body; and a wiring base plate bonded to a top surface of the pedestal member with a first bonding material placed therebetween and connected to the connector.

5 Claims, 12 Drawing Sheets

(58) Field of Classification Search
USPC .............................. 361/728–730, 752, 807
See application file for complete search history.

(56) References Cited

U.S. PATENT DOCUMENTS

| | | | |
|---|---|---|---|
| 7,679,923 B2* | 3/2010 | Inagaki | H05K 3/284 |
| | | | 174/521 |
| 9,277,658 B2* | 3/2016 | Tanaka | H05K 5/0043 |
| 2003/0193095 A1 | 10/2003 | Sasaki et al. | |
| 2005/0190539 A1* | 9/2005 | Watanabe | H05K 7/20854 |
| | | | 361/704 |
| 2008/0157680 A1* | 7/2008 | Tominaga | H05K 3/32 |
| | | | 315/112 |
| 2012/0320544 A1* | 12/2012 | Ohhashi | H05K 5/0052 |
| | | | 361/752 |
| 2014/0065877 A1* | 3/2014 | Ohhashi | H05K 5/0052 |
| | | | 439/519 |
| 2014/0285985 A1* | 9/2014 | Tanaka | H05K 5/0069 |
| | | | 361/752 |

\* cited by examiner

ELEMENT HOUSING PACKAGE AND MOUNTING STRUCTURE PROVIDED WITH SAME

TECHNICAL FIELD

The present invention relates to an element housing package for housing an element and a mounting structure provided with the same.

BACKGROUND

An element housing package for housing an element is provided with a base plate including a mounting region for mounting an element on a top surface of the base plate, a frame body disposed on the top surface of the base plate, a connector disposed on the inside and the outside of the frame body, a pedestal member positioned inside the frame body, and a wiring base plate to which the connector is electrically connected (refer to Japanese Unexamined Patent Application Publication No. 2003-309312A). Further, the wiring base plate is bonded to a top surface of the pedestal member with a bonding member placed therebetween.

In addition, in order to fix the position of the pedestal member on the inside of the element housing package, a side surface of the pedestal member is bonded to an inner surface of the frame body with a bonding member therebetween, and at the same time, a bottom surface of the pedestal member is bonded to the top surface of the base plate with a bonding member therebetween.

Here, in this type of the element housing package, during an assembly process of the element housing package and in an operation environment of the mounting structure, the base plate, the frame body, the pedestal member, and the wiring base plate are subject to heat applied from the outside of the element housing package, and also heat is generated from the element when the element is driven and the generated heat reaches the base plate, the frame body, the pedestal member, and the wiring base plate.

Therefore, as a result of temperature changes caused by an external environment of the element housing package, and temperature changes caused by the driving of the element, the base plate, the frame body, the pedestal member, and the wiring base plate thermally expand or thermally contract, and stress may occur due to differences in the thermal expansion coefficients of these members.

At that time, stress is easily applied to the pedestal member that is bonded to both the inner surface of the frame body and the top surface of the base plate, and there are cases in which the stress is concentrated on the top surface of the pedestal member. Therefore, significant stress is easily applied to the wiring base plate bonded to the top surface of the pedestal member, and cracks may occur in the wiring base plate and there may be a deterioration in the connection reliability of the wiring base plate and the connector.

In light of the above-described problem, an object of the present invention is to provide an element housing package that is capable of suppressing a deterioration in connection reliability of a wiring base plate and a connector.

SUMMARY OF THE INVENTION

An element housing package according to the present invention is provided with: a base plate including, on a top surface thereof, a mounting region for mounting an element; a frame body disposed on the top surface of the base plate so as to surround the mounting region, the frame body including a through-hole; a connector disposed so as to pass through the through-hole of the frame body and to extend from the inside to the outside of the frame body; a pedestal member disposed on the top surface of the base plate so as to be positioned in the frame body; and a wiring base plate bonded to a top surface of the pedestal member with a first bonding member placed between the wiring base plate and the top surface of the pedestal member and connected to the connector. In a longitudinal section along a through direction of the through-hole, a thickness of the frame body along the through direction of the through-hole is greater than a thickness of the base plate. In the longitudinal section along the through direction of the through-hole, a width of the pedestal member is greater than a height of the pedestal member. A side surface of the pedestal member is bonded to an inner surface of the frame body with a second bonding material placed between the side surface of the pedestal member and the inner surface of the frame body, and a bottom surface of the pedestal member is not bonded to the top surface of the base plate.

BRIEF DESCRIPTION OF THE DRAWING(S)

BEST MODE FOR CARRYING OUT THE INVENTION

Element Housing Package and Mounting Structure Provided with Same

An element housing package and a mounting structure provided with the same according to an embodiment of the present invention will be described with reference to FIG. 1 to FIG. 6.

Figure 1:
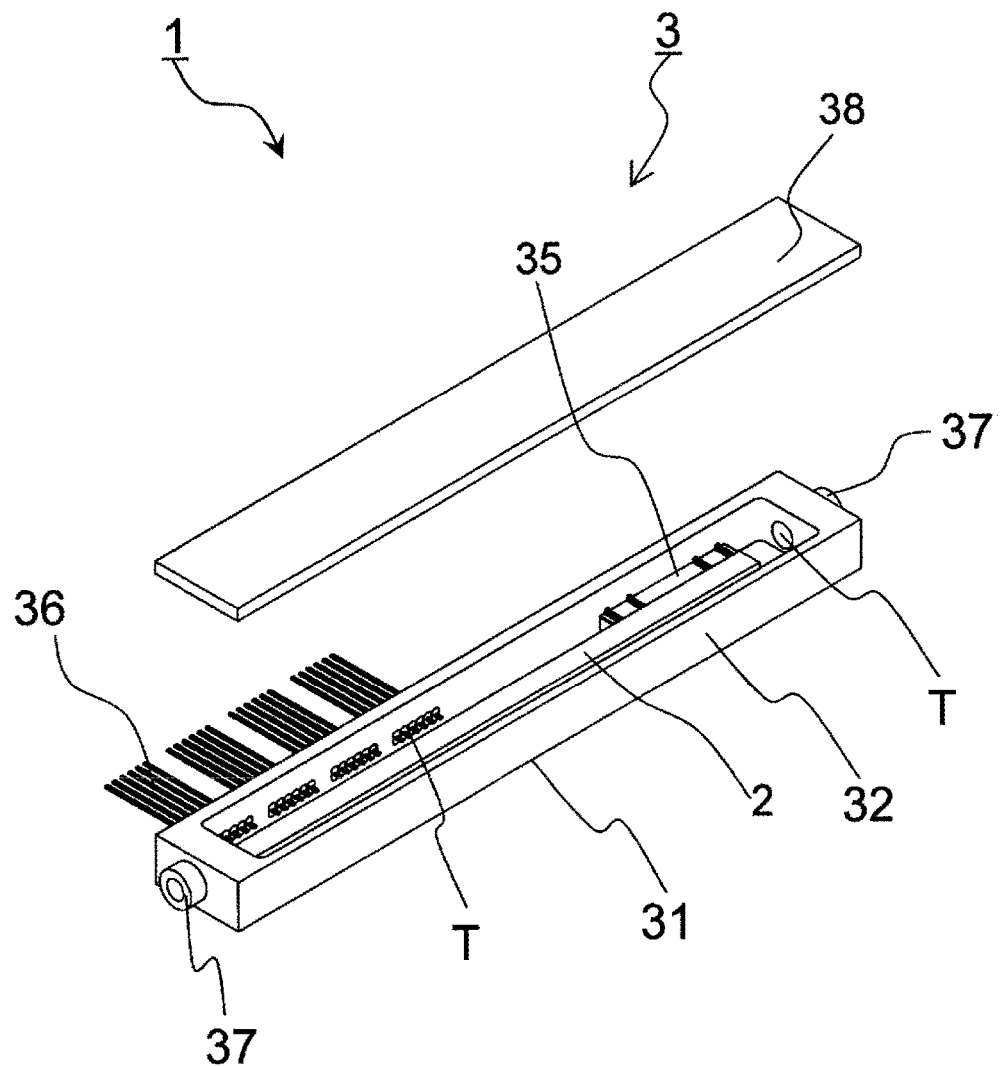
FIG. 1 is an exploded perspective view of an element housing package and a mounting structure provided with the same according to an embodiment of the present invention, in a state in which a lid is removed.

As illustrated in FIG. 1, a mounting structure 1 is provided with an element 2 and an element housing package 3.

Examples of the element 2 include an active element, such as a semiconductor element, a transistor, a laser diode, a photodiode, or a thyristor, or a passive element, such as a resistor, a capacitor, a photovoltaic cell, a piezoelectric element, a crystal resonator, an optical integrated circuit element, an optical waveguide element, an optical switching element, or a ceramic oscillator.

The element 2 is disposed in a mounting region 31b on a top surface 31a of a base plate 31. As illustrated in FIG. 1, the element 2 is housed in the element housing package 3.

Figure 2:
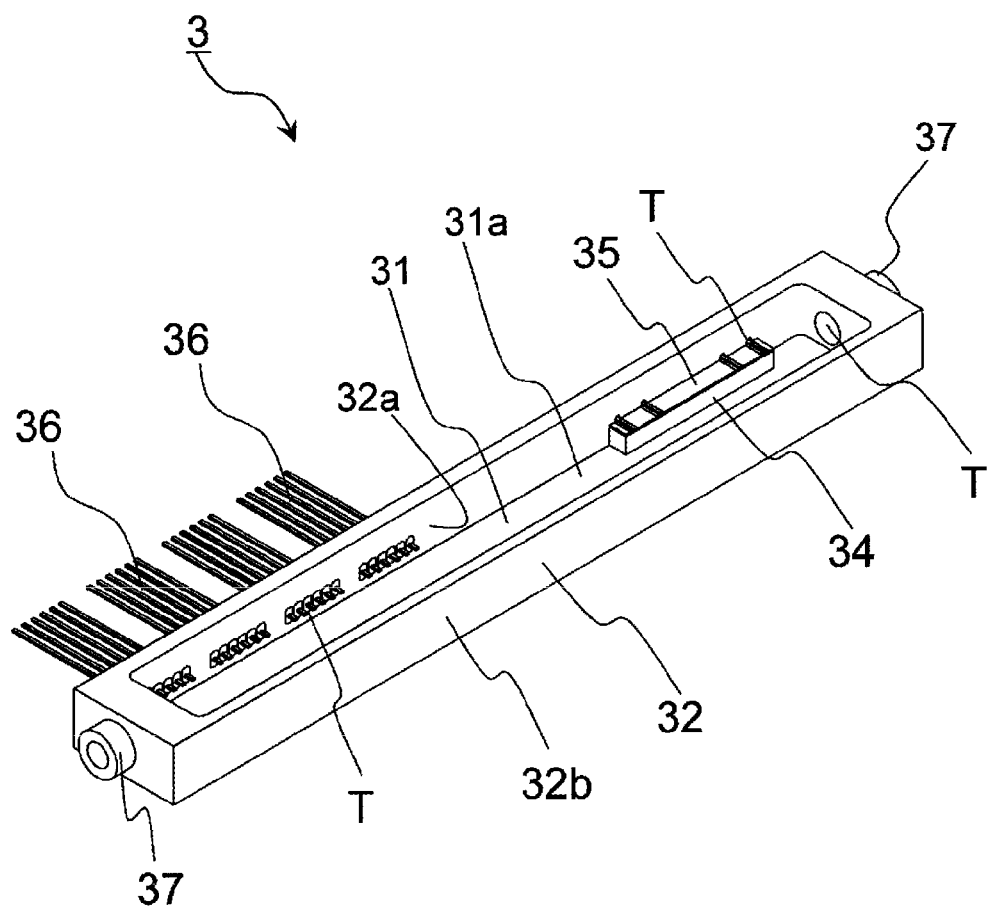
FIG. 2 is a perspective view of the element housing package illustrated in FIG. 1, as seen when the lid is removed.
Figure 3:
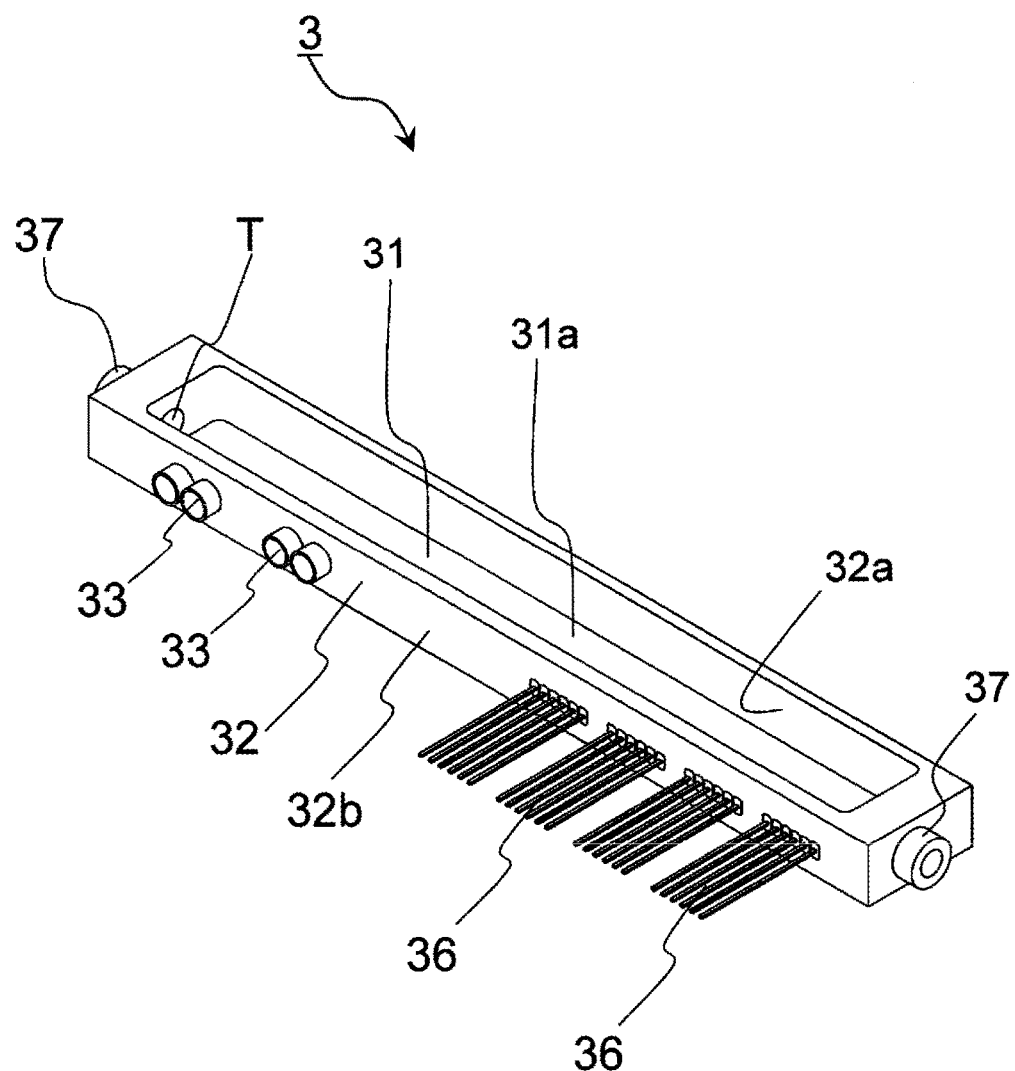
FIG. 3 is a perspective view of the element housing package illustrated in FIG. 1, as seen when the lid is removed.

As illustrated in FIG. 1 to FIG. 3, the element housing package 3 is provided with the base plate 31, a frame body 32, connectors 33, a pedestal member 34, a wiring base plate 35, lead terminals 36, and annular members 37. The element housing package 3 is suited to allow an element capable of handling a high voltage, large current/large power, or high speed/high frequency to be mounted and function therein. Note that an optical waveguide element is adopted as the element 2 of the present embodiment.

Figure 4:
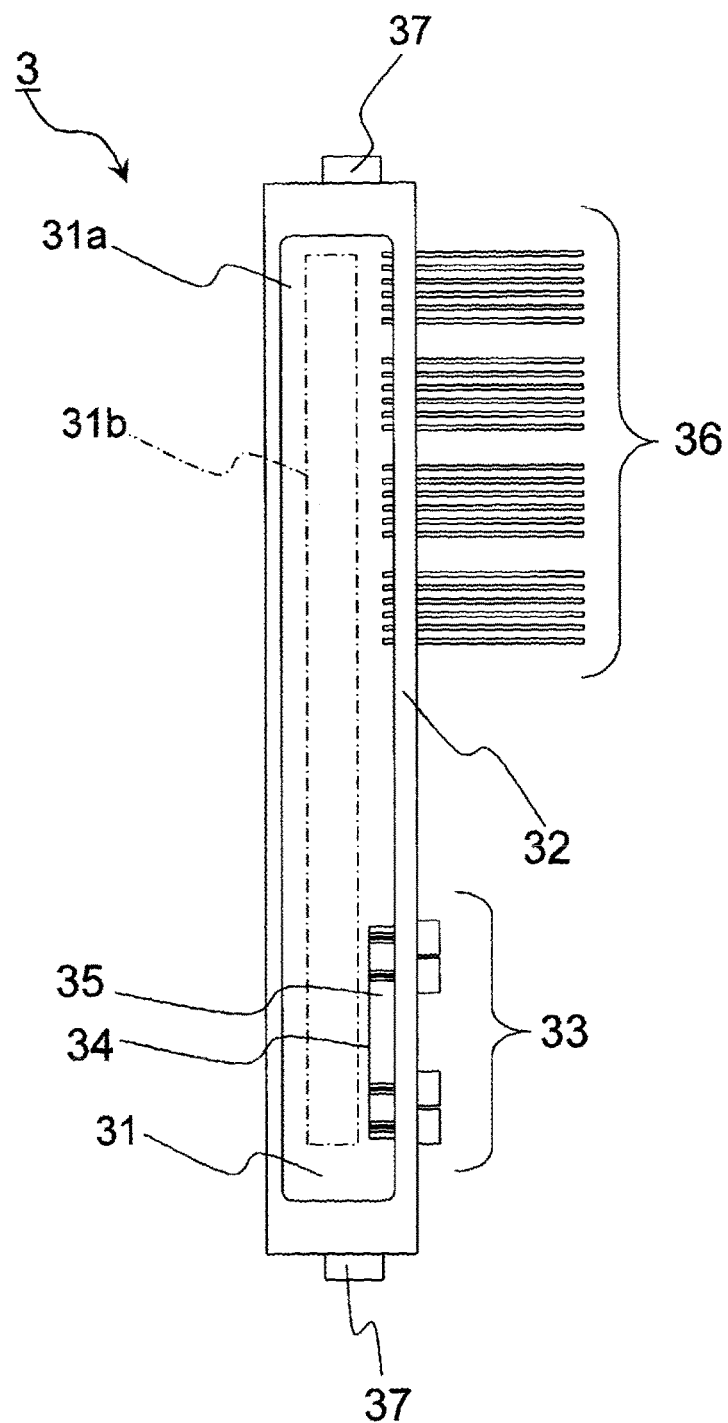
FIG. 4 is a plan view of the element housing package illustrated in FIG. 1, as seen when the lid is removed.

The base plate 31 has a function to support the element 2. The base plate 31 includes the top surface 31a. As illustrated in FIG. 4, the top surface 31a of the base plate 31 has the mounting region 31b for mounting the element 2.

As illustrated in FIG. 1 to FIG. 4, the frame body 32 is disposed on the top surface 31a of the base plate 31 so as to surround the element 2 (the mounting region 31b). A plurality of through-holes T are formed in the frame body 32. The connectors 33, the lead terminals 36, and the annular members 37 are inserted through the through-holes T of the frame body 32. Components that cause an optical signal to be input and output, such as an optical fiber, a ferrule, and the like are fixed to the annular members 37.

In the present embodiment, the base plate 31 and the frame body 32 are integrally formed. Note that the base plate 31 and the frame body 32 need not necessarily be integrally formed, and the base plate 31 and the frame body 32 may be individually formed. Note that, when the base plate 31 and the frame body 32 are individually formed, the bottom surface of the frame body 32 may be bonded to the top surface 31a of the base plate 31 by a brazing material, such as a silver (Ag) brazing, or a copper-phosphorous brazing.

Materials used for the base plate 31 and the frame body 32 can be, for example, a metal such as copper, iron, tungsten, molybdenum, nickel, or cobalt, or an alloy containing these metals, a ceramic, glass, or a resin. Note that, in the base plate 31 and the frame body 32 of the present embodiment, an iron (Fe)-nickel (Ni)-cobalt (Co) alloy is adopted. In this way, for example, heat arising in the element 2 is easily dissipated by the base plate 31 and the frame body 32, which improves the heat radiating properties of the element housing package 3 as well as the airtightness and the long-term reliability of the element housing package 3. It should be noted that the thermal expansion coefficients of the base plate 31 and the frame body 32 are set to be within a range of $17.3$ to $18.7 \times 10^{-6}$/° C.

In a longitudinal section along a through direction of the through-holes T, the thickness of the frame body 32 along the through direction is set to be greater than the thickness (the thickness in the vertical direction) of the base plate 31. By making the thickness of the frame body 32 along the through direction greater than the thickness of the base plate 31 in the vertical direction, as well as allowing many connectors 33 to be held on an outer peripheral surface, stress from the base plate 31 to the frame body 32 at the time of thermal expansion and contraction can be suppressed.

Further, as well as enabling the rigidity of the element housing package 3 to be improved, deformation of the element housing package 3 and the frame body 32 caused by an external force or thermal stress can also be suppressed. Note that the thickness of the frame body 32 along the through direction is set to be within a range of 1 mm to 6 mm. The thickness of the frame body 31 (in the vertical direction) is set to be within a range of 1 mm to 5 mm. Of the frame body 32, the thickness of a side wall where the connectors 33 and the pedestal member 34 are connected is preferably greater than the thickness (in the vertical direction) of the base plate 31, and the thickness of side walls where the connectors 33 and the pedestal member 34 are not connected may be less than the thickness of the side wall where the connectors 33 and the pedestal member 34 are connected. Thus, deformation of the side wall of the frame body 32, caused by an external force or thermal stress, where the connectors 33 and the pedestal member 34 are connected can be suppressed, and at the same time, an interior capacity of the element housing package 3 can be increased.

The annular member 37 has a function to hold the component, such as the optical fiber, or the ferrule. Specifically, a component made of metal, to which the optical fiber, the ferrule, or the like is fixed, is bonded to the annular member 37 by welding or soldering. The annular member 37 is bonded to an outer surface 32b of the frame body 32 via a brazing material or the like. The annular member 37 is bonded to a periphery of the through-hole T.

The component of the optical fiber, the ferrule, or the like held by the annular member 37 is fixed to the through-hole T of the frame body 32, and is optically connected to the element 2 positioned on the inside of the frame body 32. Note that, in the present embodiment, two of the annular members 37 are disposed. For example, an optical signal is input from the optical fiber, the ferrule, or the like fixed to one of the annular members 37, and the optical signal is output from the optical fiber, the ferrule, or the like fixed to the other annular member 37.

Figure 5:
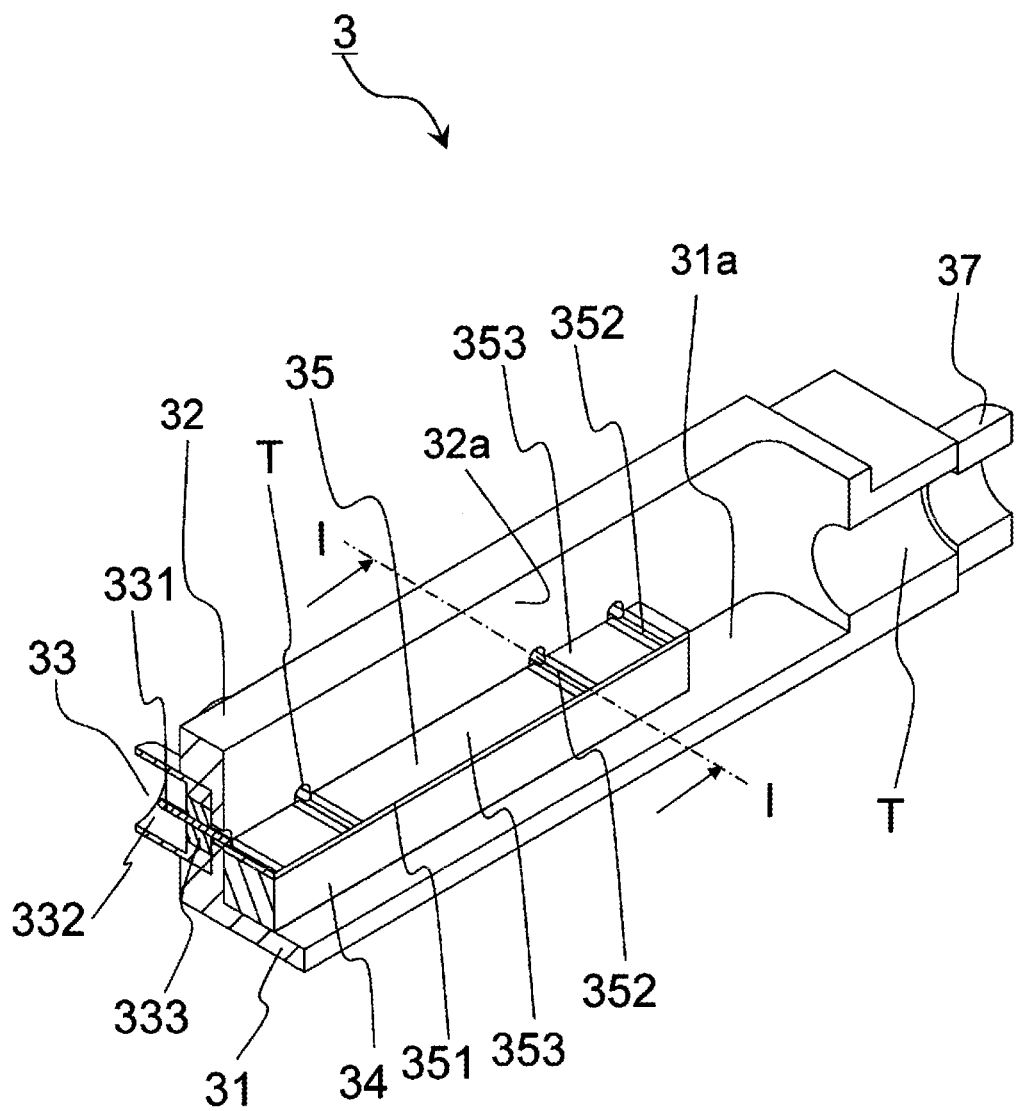
FIG. 5 is a cross-sectional perspective view illustrating main parts of the element housing package illustrated in FIG. 1.
Figure 6:
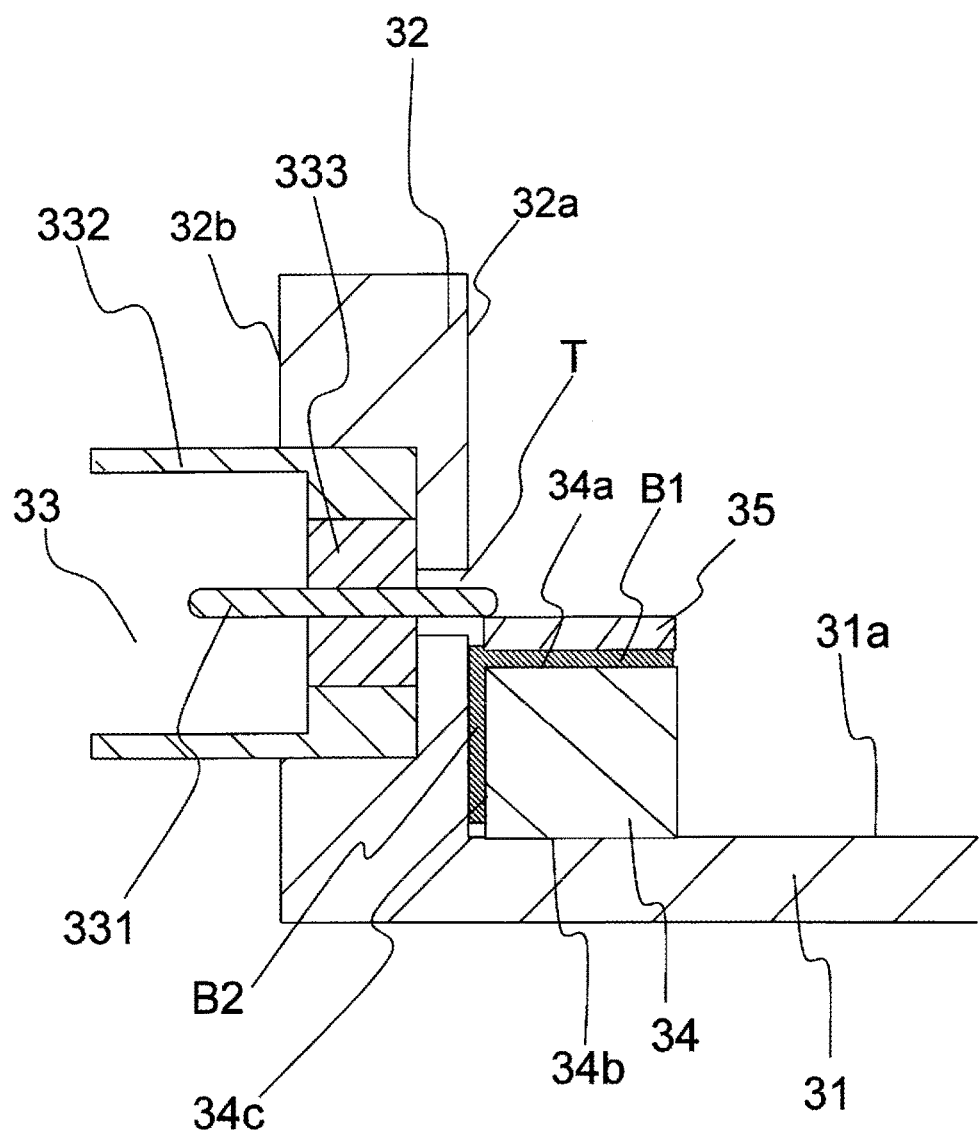
FIG. 6 is a cross-sectional view along a line I-I in FIG. 5.

The connector 33 has a function to connect the wiring base plate 35 and an external cable (not illustrated in the drawings). As illustrated in FIG. 5 and FIG. 6, the connector 33 is disposed so as to pass through the through-hole T of the frame body 32 and to extend from the outside to the inside of the frame body 32. In the present embodiment, four of the connectors 33 are disposed. Note that the number of the connectors 33 may be changed as applicable according to a product design.

The connector 33 includes a central conductor 331, an outer peripheral conductor 332, and a dielectric body 333. Further, as illustrated in FIG. 6, the connector 33 is bonded to an inner surface of a connector housing part that is formed in the outer surface 32b of the frame body 32 and that is recessed to the side of an inner surface 32a of the frame body 32.

As illustrated in FIG. 5 and FIG. 6, the central conductor 331 is provided extending from the inside to the outside of the frame body 32. The dielectric body 333 and the outer peripheral conductor 332 are disposed around the central conductor 331. The central conductor 331 passes through a central axis of the outer peripheral conductor 332 and is inserted into the outer peripheral conductor 332.

The dielectric body 333 is disposed so as to surround the central conductor 331. Further, the dielectric body 333 is disposed between the central conductor 331 and the outer peripheral conductor 332. A material of the dielectric body 333 is an insulating material. For example, the material includes glass, resin, or the like.

The outer peripheral conductor 332 is disposed so as to surround the outer periphery of the central conductor 331 with the dielectric body 333 placed therebetween. Specifically, the outer peripheral conductor 332 surrounds both the central conductor 331 and the dielectric body 333. Further, the outer peripheral conductor 332 holds the central conductor 331 and the dielectric body 333. As illustrated in FIG. 5 and FIG. 6, the outer peripheral conductor 332 is disposed on the outer surface 32b of the frame body 32. The outer peripheral conductor 332 is positioned inside the connector housing part formed in the outer surface 32b of the frame body 32. The outer peripheral conductor 332 is bonded to the inner surface of the connector housing part with a brazing material or the like. The outer peripheral conductor 332 is bonded to the periphery of the through-hole T in the frame body 32.

As illustrated in FIG. 5 and FIG. 6, in the connector 33, a part of the central conductor 331 is positioned on the outside of the frame body 32, and the other part of the central conductor 331 is positioned on the inside of the frame body 32. The external cable or the like is connected to the central conductor 331 of the connector 33 positioned on the outside of the frame body 32, and a signal wire 352 of the wiring base plate 35 is connected to the central conductor 331 of the connector 33 positioned on the inside of the frame body 32. The connector 33 transmits a signal of a high frequency input from the external cable or the like to a signal wire 352 of the wiring base plate 35.

The connector 33 of the present embodiment has a coaxial connector structure. When the connector 33 has the coaxial connector structure, for example, the central conductor 331 that is made of a metal such as an iron-nickel-cobalt alloy is inserted into the outer peripheral conductor 332 that is made of a metal such as an iron-nickel-cobalt alloy, and the dielectric body 333 made of glass or the like is disposed between the central conductor 331 and the outer peripheral conductor 332. In this manner, the central conductor 331 is held on the inside of the outer peripheral conductor 332 by the dielectric body 333.

Materials used for the central conductor 331 and the outer peripheral conductor 332 can be, for example, a metal such as copper, iron, tungsten, molybdenum, nickel, or cobalt, or an alloy containing these metals.

The pedestal member 34 has a function to support the wiring base plate 35. The pedestal member 34 is positioned on the inside of the frame body 32, and is disposed on the top surface 31a of the base plate 31. As illustrated in FIG. 5 and FIG. 6, the pedestal member 34 is adjacent to the through-holes T of the frame body 32. Note that the pedestal member 34 of the present embodiment has a cuboid shape, but is not limited to this example.

The pedestal member 34 has a top surface 34a, a bottom surface 34b, and a side surface 34c. The wiring base plate 35 is disposed on the top surface 34a of the pedestal member 34. The wiring base plate 35 is bonded to the top surface 34a of the pedestal member 34 with a first bonding member B1 placed therebetween. Note that, in the present embodiment, the first bonding member B1 is disposed over substantially the whole of a bottom surface of the wiring base plate 35.

Further, of the pedestal member 34, the side surface 34c facing the inner surface 32a of the frame body 32 is bonded to the inner surface 32a of the frame body 32 with a second bonding material B2 placed therebetween. Note that, in the present embodiment, on the pedestal member 34, the second bonding member B2 is disposed over substantially the whole of the side surface 34c facing the inner surface 32a of the frame body 32. Examples of the first bonding material B1 and the second bonding material B2 include a brazing material, such as a solder, or silver brazing.

As illustrated in FIG. 6, the first bonding material B1 and the second bonding material B2 of the present embodiment may come into contact with each other at end portions of respective bonded locations. Specifically, the first bonding material B1 and the second bonding material B2 may be formed in an integrated manner. In this way, the pedestal member 34 can be bonded to the inner surface 32a of the frame body 32, and at the same time, the wiring base plate 35 can be bonded to the top surface 34a of the pedestal member 34. As a result, a position shift of the pedestal member 34 or the wiring base plate 35 can be suppressed, along with suppressing peeling of the pedestal member 34 from the inner surface 32a of the frame body 32, or peeling of the wiring base plate 35 from the pedestal member 34. In addition, the heat radiating properties can be improved via the first bonding material B1 and the second bonding material B2 that extend from the wiring base plate 35 to the frame body 32.

The bottom surface 34b of the pedestal member 34 is not bonded to the top surface 31a of the base plate 31. Specifically, there is no bonding material interposed between the bottom surface 34b of the pedestal member 34 and the top surface 31a of the base plate 31.

Of the pedestal member 34, the side surface 34c is bonded to the inner surface 32a of the frame body 32, but the bottom surface 34b is not bonded to the top surface 31a of the base plate 31. Note that, although the pedestal member 34 is not bonded to the top surface 31a of the base plate 31, the pedestal member 34 is bonded to the inner surface 32a of the frame body 32, and the frame body 32 is integrally formed with the base plate 31. Therefore, the position of the pedestal member 34 inside the element housing package 3 is fixed.

Further, when the bottom surface 34b of the pedestal member 34 is bonded to the top surface 31a of the base plate 31, and the side surface 34c of the pedestal member 34 is not bonded to the inner surface 32a of the frame body 32, the position of the pedestal member 34 may become displaced by deformation of the base plate 31 caused by thermal expansion and thermal contraction of the base plate 31, or the pedestal member 34 may deform. As a result, positions of the wiring base plate 35 (the signal wire 352) bonded to the top surface of the pedestal member 34 and the connector 33 (the central conductor 331) connected to the wiring base plate 35 may become displaced, and stress may become concentrated at a bonded part of the signal wire 352 and the central conductor 331, or stress may become concentrated on the wiring base plate 35.

In contrast, by not bonding the bottom surface 34b of the pedestal member 34 to the top surface 31a of the base plate 31, and bonding the side surface 34c of the pedestal member 34 to the inner surface 32a of the frame body 32, a position shift of the pedestal member 34 or deformation of the pedestal member 34 due to deformation of the base plate 31 caused by thermal expansion and thermal contraction of the base plate 31 can be suppressed. As a result, position shifts of the wiring base plate 35 (the signal wire 352) and the connector 33 (the central conductor 331) can be reduced, and, at the same time as inhibiting stress from being concentrated at the bonded part of the signal wire 352 and the central conductor 331, stress is inhibited from being concentrated on the wiring base plate 35.

Materials used for the pedestal member 34 can be a metal such as copper, iron, tungsten, molybdenum, nickel, or cobalt, an alloy containing these metals, ceramic, glass, or resin. Note that an alloy is adopted in the pedestal member 34 of the present embodiment. Note that a thermal expansion coefficient of the pedestal member 34 is set to be within a range of 9.4 to $10.0 \times 10^{-6}/°$ C.

In addition, with respect to the longitudinal section along the through direction of the through-holes T, a width of the pedestal member 34 is set to be greater than a height of the pedestal member 34. By setting the width of the pedestal member 34 to be greater than the height of the pedestal member 34, a mounting area of the wiring base plate 35 is secured, and stress from the pedestal member 34 to the base plate 31 at a time of thermal expansion and contraction can be alleviated. Furthermore, rigidity of the pedestal member 34 along the through direction of the through-holes T can be improved. Thus, because deformation of the pedestal member 34 in a direction along the through direction of the through-holes T can be suppressed, deformation of and stress in the wiring base plate 35 resulting from the deformation of the pedestal member 34 can be reduced. The width of the pedestal member 34 is set to be within a range of 2 mm to 5 mm, and the height of the pedestal member 34 is set to be within a range of 1 mm to 4 mm.

In the present embodiment, in order to prevent oxidation corrosion, a plated layer of nickel, gold, or the like is formed on a surface of the pedestal member 34 using the electroplating method or the electroless plating method.

In the present embodiment, the plated layer is formed on the top surface 34a and the side surface 34c of the pedestal member 34, but the plated layer is not formed on the bottom surface 34b of the pedestal member 34. Specifically, the plating layer is formed on at least the side surface 34c of the pedestal member 34, excepting the bottom surface 34b of the pedestal member 34. Then, the pedestal member 34 is bonded to the inner surface 32a of the frame body 32 by a brazing material, with the plated layer placed therebetween. A thickness of the plated layer can be set to be within a range of 0.5 μm to 9 μm, for example.

The wiring base plate 35 has a function to connect the element 2 and the central conductor 331 of the connector 33. The wiring base plate 35 is disposed over the top surface 34a of the pedestal member 34. Further, the wiring base plate 35 is bonded to the top surface 34a of the pedestal member 34 with the first bonding member B1 placed therebetween.

As illustrated in FIG. 5, the wiring base plate 35 includes an insulation base plate 351, the signal wires 352, and a conductive film 353.

The insulation base plate 351 has a function to support the signal wires 352 and the conductive film 353. A material of the insulation base plate 351 can be ceramic, such as an aluminum oxide-based sintered body, a mullite-based sintered body, a silicon carbide sintered body, an aluminum nitride sintered body, or a silicon nitride sintered body, for example. The thermal expansion coefficient of the insulation base plate 351 is set to be within a range of 2 to $8 \times 10^{-6}/°$ C.

The signal wire 352 has a function to transmit electrical signals between the element 2 and the connector 33. The signal wire 352 is disposed on a top surface of the insulation base plate 351. The signal wire 352 is connected, via a brazing material such as a solder or silver brazing, to an end portion of the central conductor 331 positioned on the inside of the frame body 32.

The conductive film 353 is disposed on the top surface of the insulation base plate 351. The conductive film 353 positioned on the top surface of the insulation base plate 351 is positioned on both sides of the signal wire 352, and is not in contact with the signal wire 352. The conductive film 353 is set to a specified potential such as a ground potential.

In the wiring base plate 35, a coplanar line is configured by forming the conductive film 353 separated from the signal wire 352 on the top surface of the insulation base plate 351, and thus a high frequency signal transmitted through the signal wire 352 can be more easily matched to a specific impedance, transmission loss with respect to the high frequency signal can be suppressed, and the high frequency signal can be efficiently input and output.

The lead terminal 36 has a function to transmit an electrical signal from the outside to the element 2. As illustrated in FIG. 1 and FIG. 2, the plurality of lead terminals 36 are inserted through the through-holes T of the frame body 32. Each of the plurality of lead terminals 36 is inserted through each of the through-holes T with an insulating member, such as ceramic, placed therebetween. A direct current voltage is applied to the lead terminals 36 of the present embodiment.

The lid 38 has a function to protect the element 2. As illustrated in FIG. 1, the lid 38 seals an opening of the element housing package 3. The lid 38 is bonded to the frame body 32 with a seal ring or the like placed therebetween. A material of the lid 38 can be, for example, a metal material such as iron, copper, silver, nickel, chrome, cobalt, molybdenum, or tungsten, or an alloy containing a plurality of these metal materials in combination.

In the element housing package 3, the side surface 34c of the pedestal member 34 is bonded to the inner surface 32a of the frame body 32, while the bottom surface 34b of the pedestal member 34 is not bonded to the top surface 31a of the base plate 31. For example, during an assembly process of the element housing package 3 or in an operating environment of the mounting structure, even when heat applied to the element housing package 3 and heat arising in the element 2 are transmitted to the base plate 31, the frame body 32, the pedestal member 34, and the wiring base plate 35, and the base plate 31, the frame body 32, the pedestal member 34, and the wiring base plate 35 thermally expand and thermally contract, the pedestal member 34 is only bonded to the frame body 32 and is not bonded to the base plate 31. Therefore, stress caused by the thermal expansion and the thermal contraction of the base plate 31 is less likely to be applied to the pedestal member 34. In this way, stress is less likely to be concentrated on the top surface 34a of the pedestal member 34, and therefore less stress is applied to the wiring base plate 35 bonded to the top surface 34a of the pedestal member 34, and less stress also occurs in a bonded part of the connector 33 and the wiring base plate 35. Therefore, the occurrence of cracks in the wiring base plate 35, and peeling of the connector 33 from the wiring base plate 35 can be reduced, and a deterioration in connection reliability between the wiring base plate 35 and the connector 33 can be suppressed.

Of the pedestal member 34, not the side surface 34c, but the bottom surface 34b is not bonded. Here, the thermal expansion and the thermal contraction of the base plate 31 tend to contribute significantly to the stress applied to the top surface 34a of the pedestal member 34. Therefore, when the bottom surface 34b of the pedestal member 34 is bonded to the top surface 31a of the base plate 31 and the side surface 34c of the pedestal member 34 is not bonded to the inner surface 32a of the frame body 32, for example, a comparatively large stress is more easily applied to the pedestal member 34 from the base plate 31, as described above, and as a result, stress is more easily applied to the wiring base plate 35 bonded to the top surface 34a of the pedestal member 34.

In contrast, in the element housing package 3, the side surface 34c of the pedestal member 34 is bonded to the inner surface 32a of the frame body 32, while the bottom surface 34b of the pedestal member 34 is not bonded to the top surface 31a of the base plate 31, thus reducing the stress applied to the top surface 34a of the pedestal member 34 caused by the thermal expansion and the thermal contraction of the base plate 31, as described above. As a result, as well as being able to reduce a large stress applied to the wiring base plate 35 bonded to the top surface 34a of the pedestal member 34, a large stress applied to the bonded part of the signal wire 352 and the central conductor 331 can also be reduced. Therefore, the occurrence of cracks in the wiring base plate 35, the peeling of the central conductor 331 from the signal wire 352, and the position shift occurring between the signal wire 352 and the central conductor 331 can be reduced, and the deterioration in the connection reliability between the wiring base plate 35 and the connector 33 can be suppressed.

In the element housing package 3, the plated layer is formed on the top surface 34a and the side surface 34c of the pedestal member 34, while the plated layer is not formed on the bottom surface 34b of the pedestal member 34. By forming the plated layer on the top surface 34a and the side surface 34c of the pedestal member 34, oxidation corrosion of the top surface 34a and the side surface 34c of the pedestal member 34 can be prevented. In addition, because the plated layer is not formed on the bottom surface 34b of the pedestal member 34, it becomes more difficult to bond the bottom surface 34b of the pedestal member 34 to the top surface 31a of the base plate 31 using a bonding material, such as a brazing material, and the stress applied to the top surface 34a of the pedestal 34 can be reduced, as described above, thereby enabling a reduction in the occurrence of cracks in the wiring base plate 35.

The mounting structure 1 houses the element 2 inside the above-described element housing package 3. The element 2 is mounted in the mounting region 31b of the base plate 31. The element housing package 3 can suppress a deterioration in connection reliability of the wiring base plate 35 and the central conductor 331 of the connector 33.

The present invention is not limited to the above-described embodiment, and various modifications and improvements are possible insofar as they do not depart from the spirit and scope of the present invention.

Figure 7:
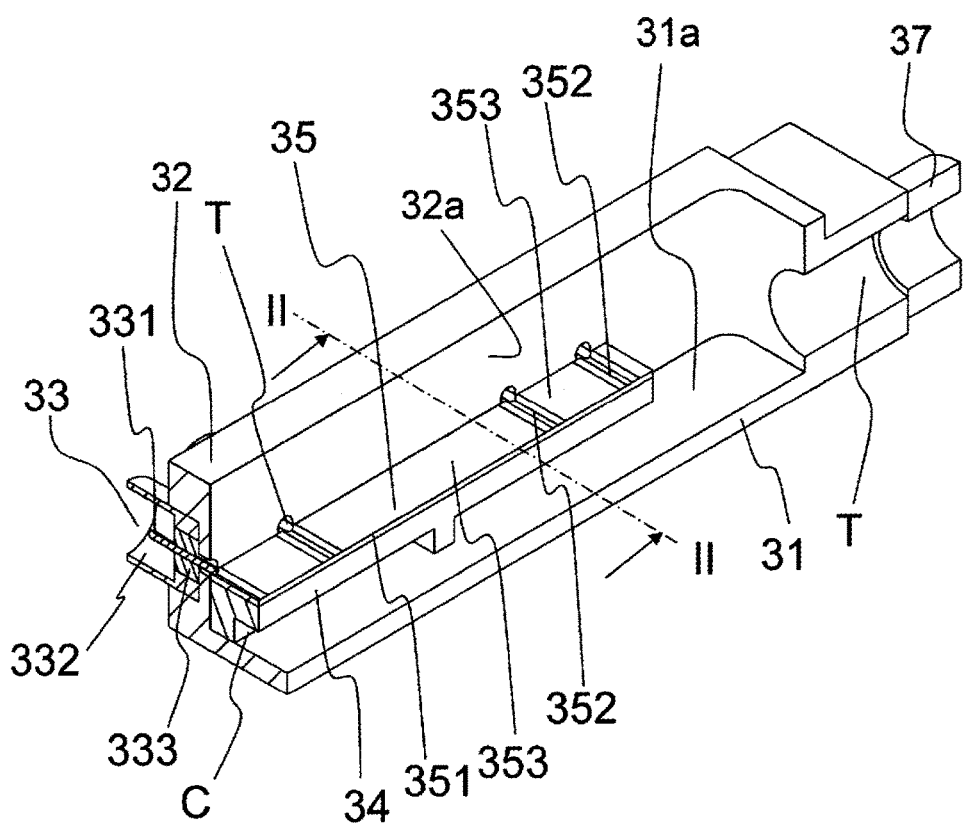
FIG. 7 is a cross-sectional perspective view illustrating main parts of the element housing package according to another embodiment of the present invention.
Figure 8:
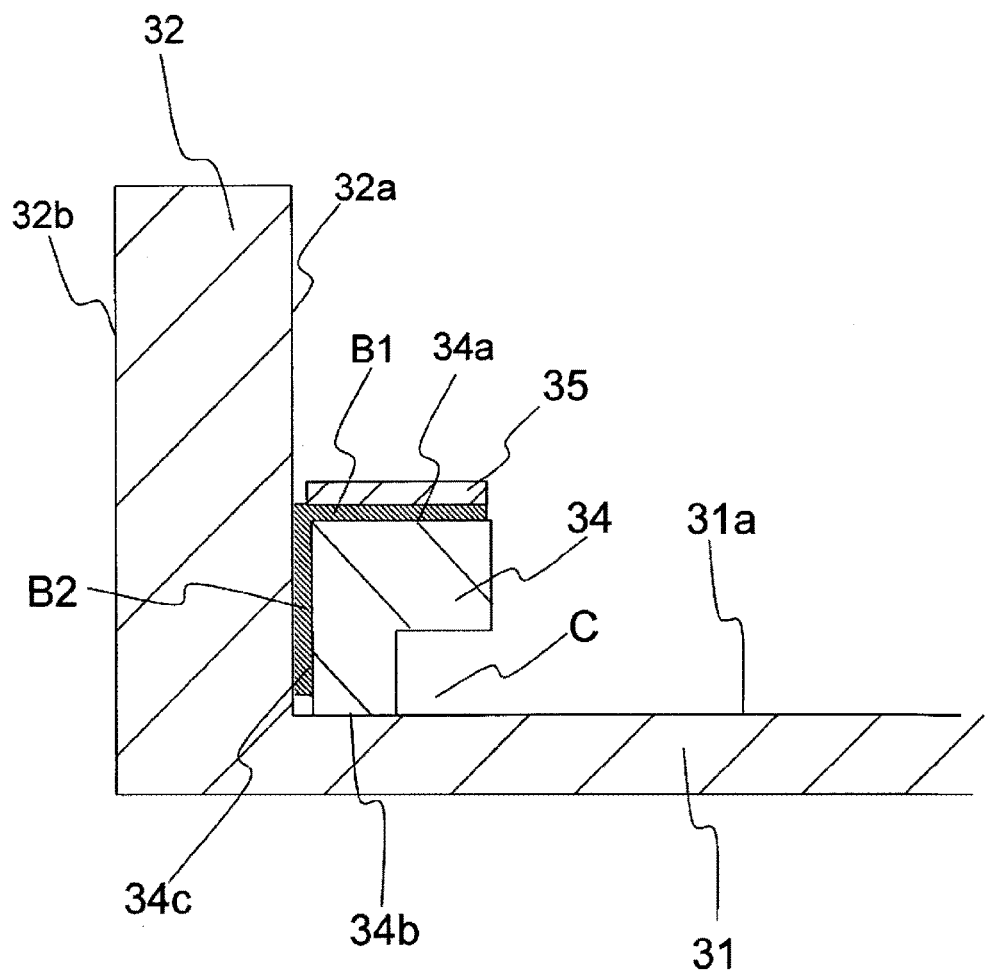
FIG. 8 is a cross-sectional view along a line II-II in FIG. 7.

As illustrated in FIG. 7 and FIG. 8, a cut portion C may be formed extending from the bottom surface 34b of the pedestal member 34 toward the mounting region 31b. In this way, a contact area between the bottom surface 34b of the pedestal member 34 and the top surface 31a of the base plate 31 becomes smaller, and thus, in the assembly process of the element housing package 3 or in the operating environment of the mounting structure, even when the base plate 31 thermally expands or thermally contracts due to heat applied to the element housing package 3 or heat arising in the element 2, it is possible to prevent stress from being applied to the pedestal member 34 from the base plate 31.

In the pedestal member 34, at least a part of the cut portion C provided extending from the bottom surface 34b of the pedestal member 34 toward the mounting region 31b may have a contact part that is in contact with the top surface 31a of the base plate 31. In this way, even when the element housing package 3 is heated or cooled in the assembly process of the element housing package 3 or in the operating environment of the mounting structure, and the frame body 32 and the pedestal member 34 deform as a result of thermal expansion and thermal contraction, the contact part can suppress the pedestal member 34 from being inclined with respect to the top surface 31a of the base plate 31.

Figure 9:
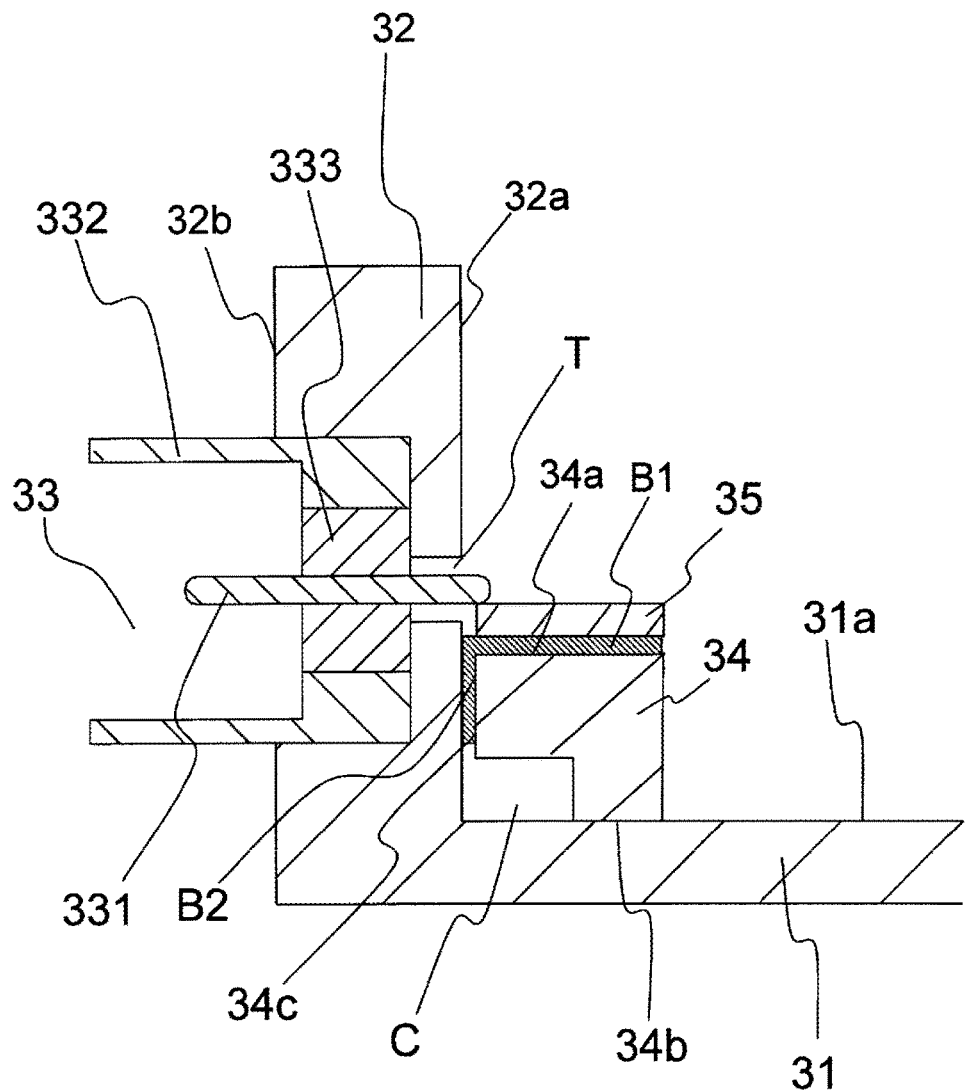
FIG. 9 is a cross-sectional view illustrating main parts of the element housing package according to still another embodiment of the present invention.
Figure 10:
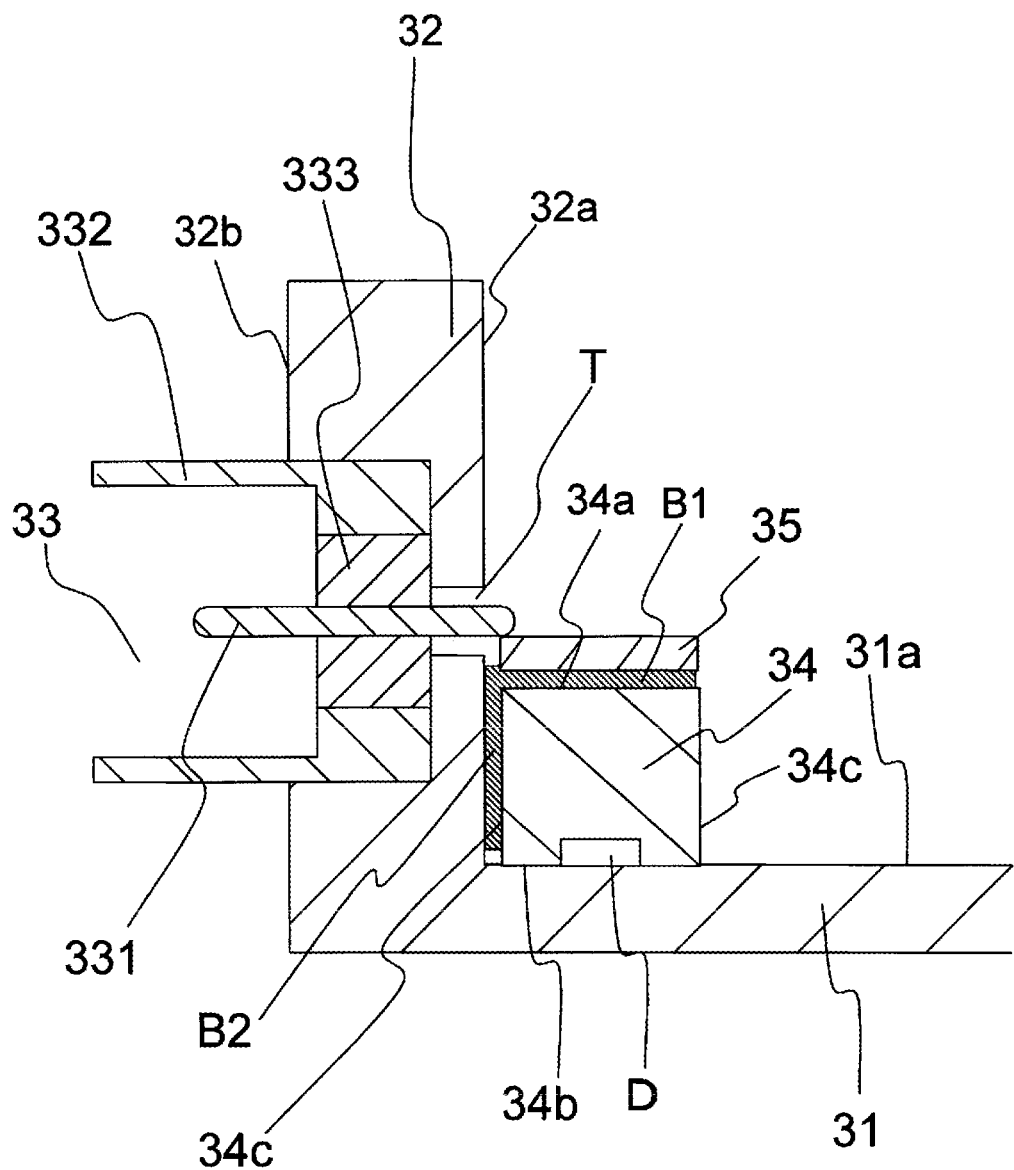
FIG. 10 is a cross-sectional view illustrating main parts of the element housing package according to yet still another embodiment of the present invention.

As illustrated in FIG. 9, the cut portion C may be formed in the bottom surface 34b of the pedestal member 34, extending toward the inner surface 32a of the frame body 32. In this way, even when the element housing package 3 is heated or cooled in the assembly process of the element housing package 3 or in the operating environment of the mounting structure, and the frame body 32 and the pedestal member 34 deform as a result of thermal expansion and thermal contraction, because the contact part between the frame body 32 and the pedestal member 34 is made smaller, the stress form the frame body 32 to the pedestal member 34 can be alleviated and peeling of the pedestal member 34 from the frame body 32 can be suppressed. As illustrated in FIG. 10, a recess portion D may be formed in the bottom surface 34b of the pedestal member 34 so as to be separated from the side surface 34c of the pedestal member 34. In this way, the contact area between the bottom surface 34b of the pedestal member 34 and the top surface 31a of the base plate 31 becomes smaller, and thus, in the assembly process of the element housing package 3 or in the operating environment of the mounting structure, even when the base plate 31 thermally expands or thermally contracts due to heat applied to the element housing package 3 or heat arising in the element 2, the stress occurring in the pedestal member 34 can be easily released through the recess portion D, and the pedestal member 34 can be installed on the top surface 31a of the base plate 31 in a stable manner. As a result, inclination and a position shift of the pedestal member 34 and the wiring base plate 35 can be suppressed.

Figure 11:
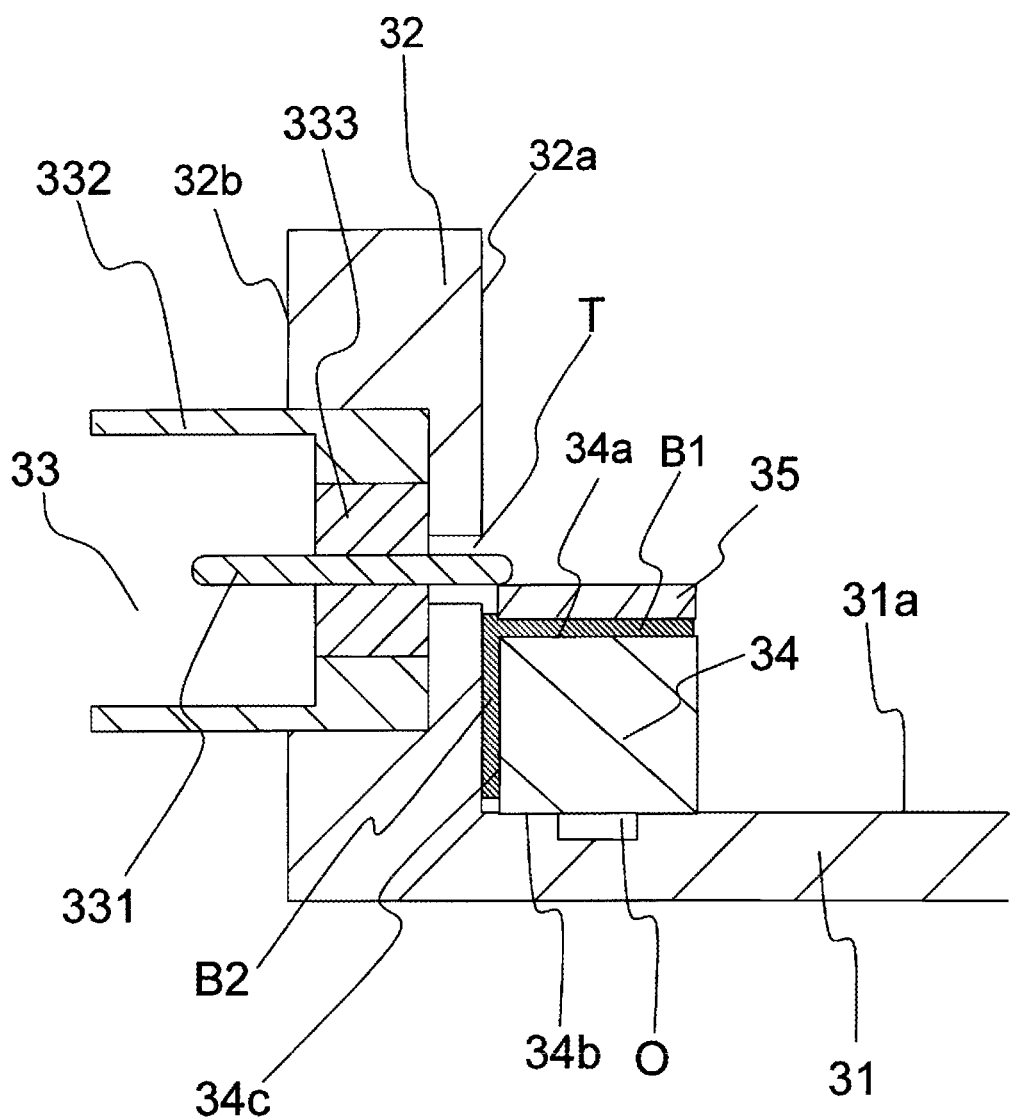
FIG. 11 is a cross-sectional view illustrating main parts of the element housing package according to yet still another embodiment of the present invention.

As illustrated in FIG. 11, a recess portion O may be formed in the top surface 31a of the base plate 31 facing the bottom surface 34b of the pedestal member 34. In this way, the contact area between the bottom surface 34b of the pedestal member 34 and the top surface 31a of the base plate 31 becomes smaller, and thus, even when the base plate 31 thermally expands and thermally contracts as a result of heat arising in the element 2, while suppressing inclination of the pedestal member 34 with respect to the top surface 31a of the base plate 31, the stress applied to the wiring base plate 35 can be further reduced. Because the pedestal member 34 can be installed on the top surface 31a of the base plate 31 in a stable manner, inclination and a position shift of the pedestal member 34 and the wiring base plate 35 can be suppressed.

Figure 12:
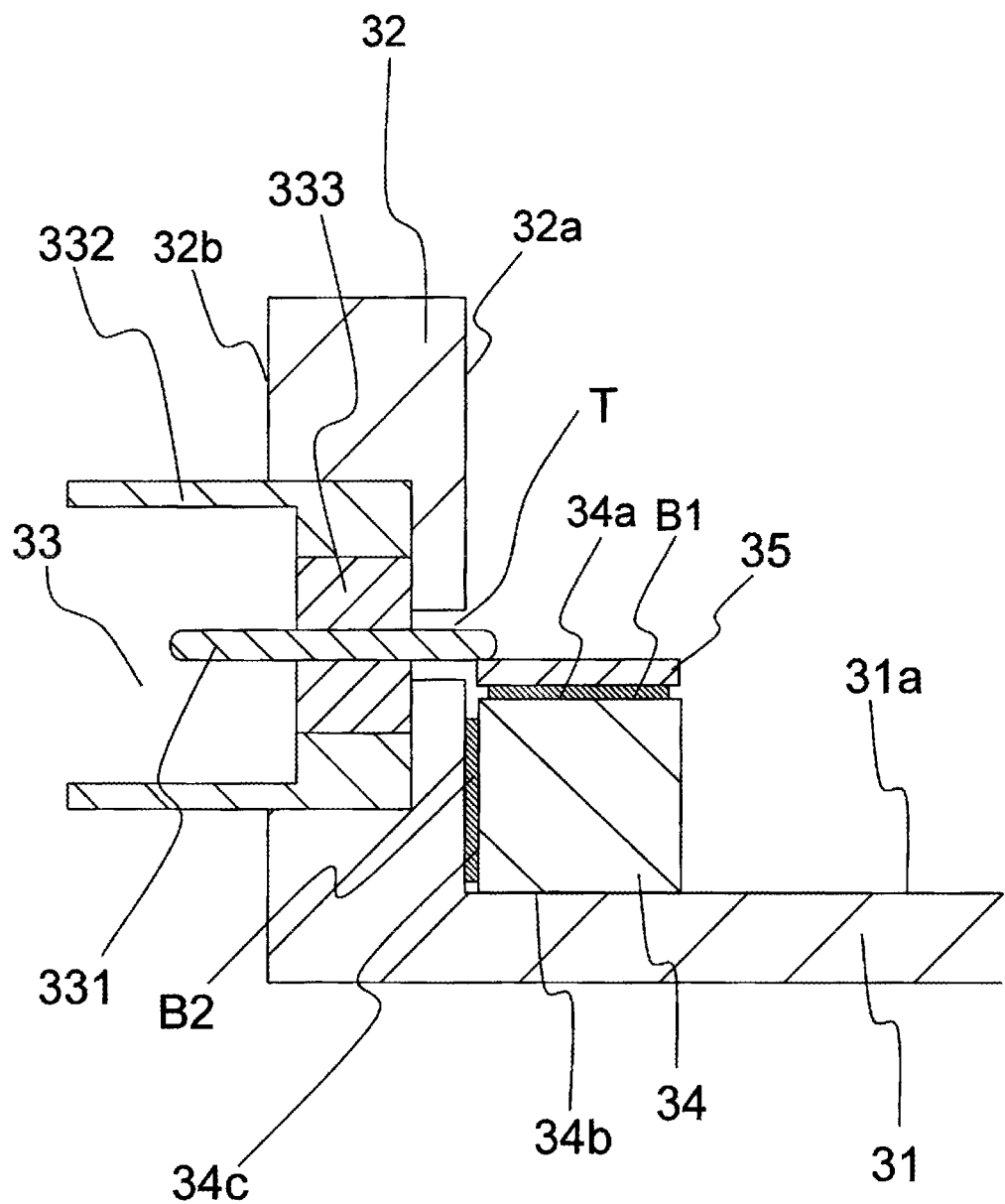
FIG. 12 is a cross-sectional view illustrating main parts of the element housing package according to yet still another embodiment of the present invention.

As illustrated in FIG. 12, the first bonding material B1 and the second bonding material B2 may be disposed with an interval between the first bonding material B1 and the second bonding material B2. Specifically, the first bonding material B1 and the second bonding material B2 may be disposed so as not to come into contact with each other. In this way, even when the base plate 31 and the frame body 32 thermally expand or thermally contract, because the contact area between the pedestal member 34 and the wiring base plate 35 and between the pedestal member 34 and the frame body 32 can be made smaller, the stress from the frame body 32 to the pedestal member 34 and the second bonding material B2 can be reduced, and the stress from the pedestal member 34 to the wiring base plate 35 can be reduced.

Manufacturing Method of Element Housing Package and Mounting Structure

Below, a manufacturing method of the element housing package 3 and the mounting structure 1 illustrated in FIG. 1 will be described. Note that the present invention is not limited to the embodiments described below.

First, the base plate 31, the frame body 32, the pedestal member 34, and the annular member 37 are manufactured. Each of the base plate 31, the frame body 32, the pedestal member 34, and the annular member 37 is manufactured by forming an ingot, obtained by casting a molten metal material into a mold and causing it to harden, in a predetermined shape using a metal machining method. Then, the base plate 31, the frame body 32 in which the plurality of through-holes T are formed, the pedestal member 34, and the annular member 37 are formed.

Next, the frame body 32 is disposed on the top surface 31a of the base plate 31, and the annular member 37 is disposed so as to overlap the through-hole T. At the same time, the lead terminal 36 is inserted through the through-hole T, and each of the members are bonded by silver brazing.

Next, the wiring base plate 35 that has the insulation base plate 351, the signal wire 352, and the conductive film 353 is manufactured. For example, a mixture obtained by adding and mixing an organic binder, a plasticizer, a solvent, or the like with ceramic powder, such as aluminum oxide, boron nitride, aluminum nitride, silicon nitride, silicon carbide, or beryllium oxide, is machined into a predetermined shape. Next, a high melting point metal powder, such as tungsten or molybdenum, is prepared, and a metal paste is prepared by adding and mixing an organic binder, a plasticizer, a solvent, or the like into the powder. Then, the metal paste is printed in a predetermined pattern onto the surface of the mixture machined to the predetermined shape. By firing this, the wiring base plate 35 is manufactured with the metal paste forming the signal wires 352, the conductive film 353, and the mixture machined to the predetermined shape forming the insulation base plate 351.

Next, the wiring base plate 35 is bonded to the top surface 34a of the pedestal member 34 with the first bonding member B1 placed therebetween. Then, the side surface 34c of the pedestal member 34 is disposed so as to be bonded to the inner surface 32a of the frame body 32 with the second bonding material B2 placed therebetween. Here, the pedestal member 34 is disposed on the top surface 31a of the base plate 31 with no bonding material interposed between the bottom surface 34b and the top surface 31a of the base plate 31.

Next, the connectors 33 are manufactured by bonding and fixing the central conductors 331 to the central axes of the outer peripheral conductors 332 with the dielectric bodies 333 placed between the central conductors 331 and the outer peripheral conductors 332. Then, the connectors 33 are inserted through the through-holes T of the frame body 32, the connectors 33 are fixed to the outer surface 32b of the frame body 32 via a brazing material or the like, and the central conductors 331 and the wiring base plate 35 are bonded.

Next, the element 2 is disposed on the mounting region 31b of the top surface 31a of the base plate 31, and the element 2 is electrically connected to the signal wires 352 and the conductive film 353 via a bonding wire or the like. The mounting structure 1 can be manufactured in this way. Note that the lid 38 can be connected so as to seal the element 2 in the mounting structure 1.

In the manufacturing method of the present embodiment, the pedestal member 34 is disposed so that the side surface 34c of the pedestal member 34 is bonded to the inner surface 32a of the frame body 32, while the bottom surface 34b of the pedestal member 34 is not bonded to the top surface 31a of the base plate 31.

Here, for example, when the element housing package 3 is heated or cooled during the assembly process of the element housing package 3 (the mounting structure 1), the base plate 31, the frame body 32, the pedestal member 34, and the wiring base plate 35 may thermally expand and thermally contract.

In response to this, the side surface 34c of the pedestal member 34 is bonded to the inner surface 32a of the frame body 32, while the bottom surface 34b of the pedestal member 34 is not bonded to the top surface 31a of the base plate 31. As a result, stress due to the thermal expansion and thermal contraction of the base plate 31 is less likely to be applied to the pedestal member 34. Therefore, the occurrence of cracks in the wiring base plate 35 can be reduced, and the element housing package 3 having the high connection reliability can be easily mass produced.

What is claimed is:

1. An element housing package comprising:
   a base plate comprising, on a top surface thereof, a mounting region for mounting an element;
   a frame body disposed on the top surface of the base plate so as to surround the mounting region, the frame body comprising a through-hole;
   a connector disposed so as to pass through the through-hole of the frame body and to extend from an inside to an outside of the frame body;
   a pedestal member disposed on the top surface of the base plate so as to be positioned in the frame body; and
   a wiring base plate bonded to a top surface of the pedestal member with a first bonding member placed between the wiring base plate and the top surface of the pedestal member and connected to the connector;
   a thickness of the frame body along a through direction of the through-hole being greater than a thickness of the base plate in a longitudinal section along the through direction;
   a width of the pedestal member being greater than a height of the pedestal member in the longitudinal section along the through direction of the through-hole; and
   a side surface of the pedestal member being bonded to an inner surface of the frame body with a second bonding material placed between the side surface of the pedestal member and the inner surface of the frame body, and a bottom surface of the pedestal member is not bonded to the top surface of the base plate.

2. The element housing package according to claim 1, wherein one of a cut portion and a recess portion is formed in the bottom surface of the pedestal member.

3. The element housing package according to claim 1, wherein a recess portion is formed in the top surface of the base plate facing the bottom surface of the pedestal member.

4. The element housing package according to claim 1, wherein a plated layer is formed on the top surface and the side surface of the pedestal member, and a plated layer is not formed on the bottom surface of the pedestal member.

5. A mounting structure comprising:
   the element housing package described in claim 1; and
   an element mounted on the mounting region of the base plate.

* * * * *